United States Patent [19]

Periasamy

[11] Patent Number: 5,366,559
[45] Date of Patent: Nov. 22, 1994

[54] METHOD FOR PROTECTING A SUBSTRATE SURFACE FROM CONTAMINATION USING THE PHOTOPHORETIC EFFECT

[75] Inventor: Ravindran Periasamy, Cary, N.C.

[73] Assignee: Research Triangle Institute, Research Triangle Park, N.C.

[21] Appl. No.: 67,795

[22] Filed: May 27, 1993

[51] Int. Cl.[5] .............................................. B08B 7/00
[52] U.S. Cl. ......................................... 134/1; 134/2; 134/21; 134/902
[58] Field of Search ......................... 134/1, 2, 21, 902

[56] References Cited

U.S. PATENT DOCUMENTS

| | | | |
|---|---|---|---|
| 3,710,279 | 1/1973 | Ashkin | 331/94.5 |
| 3,808,432 | 4/1974 | Ashkin | 250/251 |
| 3,808,550 | 4/1974 | Ashkin | 331/94.5 |
| 4,744,833 | 5/1988 | Cooper et al. | 134/1 |
| 4,871,416 | 10/1989 | Fukuda | 156/635 |
| 4,902,631 | 2/1990 | Downey et al. | 437/7 |
| 4,921,544 | 5/1990 | Cowle et al. | 134/1 |
| 4,980,022 | 12/1990 | Fujimura et al. | 156/643 |
| 5,090,432 | 2/1992 | Bran | 134/139 |
| 5,100,476 | 3/1992 | Mase et al. | 134/1 |
| 5,100,832 | 3/1992 | Kitagawa et al. | 437/106 |
| 5,151,135 | 9/1992 | Magee et al. | 134/1 |
| 5,247,190 | 9/1993 | Friend et al. | 257/40 |

OTHER PUBLICATIONS

"Elimination and Manipulation of Small Particles Suspended in the Atmosphere by Laser Beam" Shimizu et al. Sep. 1992 pp. 479-484.
Symposium on Contamination Control; Donovan et al.; Oct. 1992.
Movement of Small Particles by Light, Milton Kerker, American Scientist vol. 62; Jan. 1974.
Direction, Magnitude and Causes of Photophoretic Forces, Hans Rohatschek, Institute of Experimental Physics, Johannes Kepler University, J. Aerosol Sci., vol. 16, No. 1, pp. 29-42, 1985.
Pattern Formation and Flow Control of Fine Particles by Laser-Scanning Micromanipulation, Keiji Sasaki, Masanori Koshioka, Hiroaki Misawa, Noboru Kitamura and Hiroshi Masuhara, Oct. 1, 1991/vol. 16, No. 19/Optics Letters.
College of Technology, Japan; M. Agu, Ibaraki University, Japan; G. Grehan, G. Gouesbet, Institute National des Sciences Appliquees de Rouen, France, ICCS, Sep. 21-24, 1992, Westminster, London.
Laser-Induce Bubble Trapping in Liquids and its Effect on Light Thermal Blooming, A. Marcano O., 20 May 1992/vol. 31, No. 15/Applied Optics.
Movement of Micrometer-sized Particles in the Evanescent Field of a Laser Beam, Satoshi Kawata and Tadao Suguira, Department of Applied Physics, Osaka University, Suita, Osaka 565, Japan, Received Mar. 2, 1992.
Mechanisms of Particle Transport in Process Control, Proceedings of the Symposium on Contamination Control and Defect Reduction in Semi-Conductor Manufacturing I held Oct. 12, 1992, pp. 21-41, vol. 92-21, Electrochemical Society, Pennington, N.J..

Primary Examiner—Wayne Langel
Assistant Examiner—Thomas G. Dunn, Jr.
Attorney, Agent, or Firm—Oblon, Spivak, McClelland, Maier & Neustadt

[57] ABSTRACT

A method for processing a substrate surface in a process chamber wherein during chemical or physical altering of the substrate surface a laser beam is projected inside the processing chamber and along a trajectory which does not contact the substrate surface in order to capture particles by means of the photophoretic effect, particles which would otherwise impinge upon and contaminate the substrate surface.

20 Claims, 5 Drawing Sheets

METHOD FOR PROTECTING A SUBSTRATE SURFACE FROM CONTAMINATION USING THE PHOTOPHORETIC EFFECT

BACKGROUND OF THE INVENTION

1. Field of the Invention

This invention relates to the field of preventing contamination of a surface of a substrate during processing of the substrate.

2. Discussion of the Background

Surface contamination of substrates by particles is a serious problem at both atmospheric and sub-atmospheric pressures. Ultra-clean surfaces are desirable for processing in the microelectronics and optics industries. Particle contamination on wafer surfaces produces defects resulting in yield losses in the integrated circuit industry and reduced optical quality in the optics industry.

Even when extremely clean processing gases are used during surface processing, particles are generated due to the processing steps used for processing substrates. Those particles are usually less than 20 microns in diameter and typically less than 1 micron in diameter. Elimination of particles generated during processing steps, such as plasma deposition, plasma etching, and non-plasma processes, and identification and elimination of sources of particles produced by those processes are difficult.

Ultrasonic acoustic waves may be used to clean the substrate surface as disclosed in U.S. Pat. No. 5,090,432. However, that type of cleaning requires exposing a substrate surface to a liquid environment and that environment is incompatible with high vacuum process steps.

Electrostatic forces may be used to remove particles from a substrate surface as disclosed in U.S. Pat. No. 4,744,833. However, generation of electrostatic fields requires that the particles be charged and also interferes with processes depending upon application of a voltage to the substrate surface, such as sputtering and plasma etching processes.

Chemical reactions may be used to clean substrate surfaces, such as by removing an oxide layer from a semiconductor surface, but such cleaning processes can not selectively remove particulate deposited upon a substrate surface.

A need exists for in-situ processes which avoids contamination of a substrate surface by particles during processing.

SUMMARY OF THE INVENTION

Accordingly, it is an object of this invention to provide a product and a process for preventing particulate contamination of a substrate surface.

It is another object of this invention to provide a product and a process for preventing particulate contamination of a substrate surface while that substrate surface is being processed.

These and other objects are achieved according to the present invention by providing a new and improved process for preventing particulate contamination of a substrate surface, including the step of projecting a high intensity laser beam above a substrate surface to be protected, thereby to exert a photophoretic force upon particles upon which the laser beam impinges. Due to the photophoretic force, the laser beam captures the particles so that the particles are physically confined within the laser beam. When the laser beam projects along a trajectory which does not contact the substrate surface particles entering the laser beam are not only captured but also transported by the laser beam, thereby protecting the substrate surface from contamination by those particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
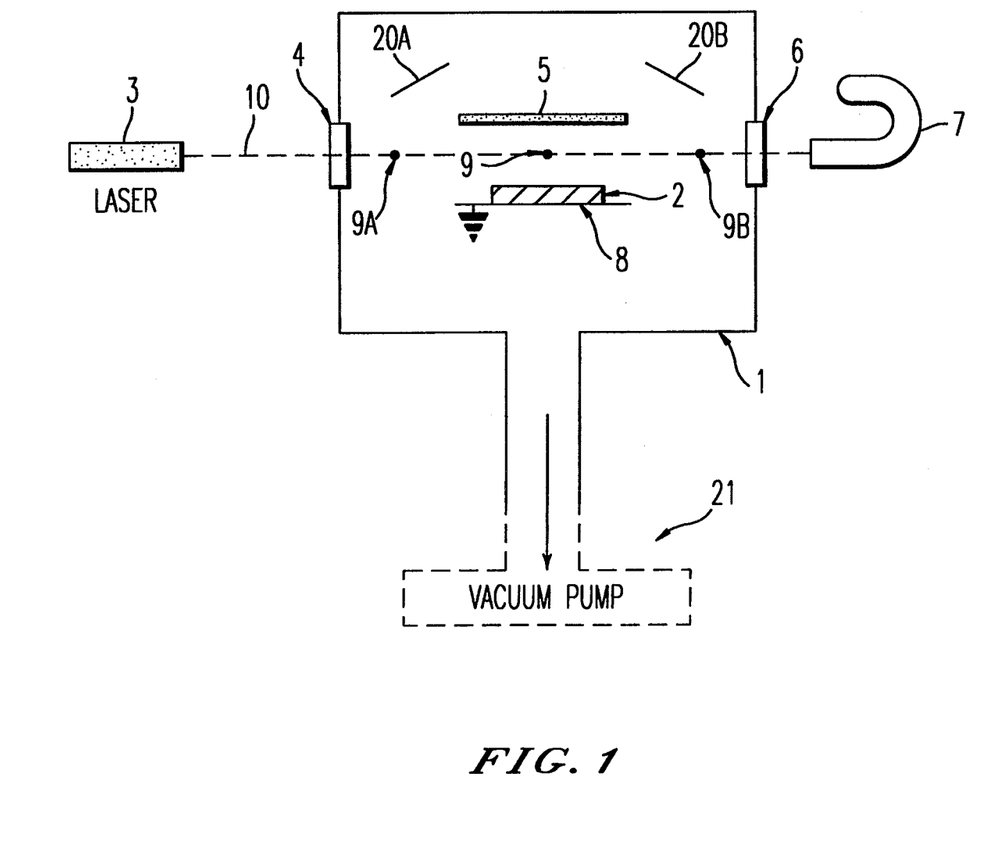
FIG. 1 is a schematic side view of a novel processing chamber incorporating a first embodiment of the invention.

Referring now to the drawings, wherein like reference numerals designate identical or corresponding parts throughout the several views, and more particularly to FIG. 1 thereof, FIG. 1 shows a containment chamber 1 in which is mounted a substrate having a substrate 2 mounted on substrate fixture 8. Laser 3 projects laser beam 10 through window 4 of the chamber so that laser beam 10 passes above the surface of substrate 2 and exits chamber 1 through laser window 6, finally impinging upon and being stopped by beam stop 7.

Laser beam 10 projects between the surface of substrate 2 and all other structural features inside chamber 1. The pressure in chamber 1 may be controlled by vacuum pump 21 to below atmospheric pressure or may be raised to pressures above atmospheric pressure by a pressurized gas line or the like, as required by a particular processing step. Substrate fixture 8 may be grounded and typically is grounded when plasma processing steps are conducted. Plasma processing, such as sputtering and plasma etching may be accomplished via high voltage electrode 5. Also shown are deposition source 20a and processing source 20b, schematically indicating that other processing equipment and processing steps, such as ion beam deposition, ion beam etching, and deposition via thermal evaporation among other such processing may be accomplished in chamber 1.

Substrate 2 may be any suitable material, such as silicon, gallium arsenide, transparent insulators for optical or electrooptic devices or other materials. Laser windows 4 and 6 may be made of glass, quartz, or other suitable optical material which is compatible with laser 3. Furthermore, laser windows 4 and 6 may be surface coated or treated in other ways to increase their transmitivity to laser beam 10. Laser window 4 may be a focusing lens selected appropriately to provide a strongly focused laser beam of a given point in the chamber.

Beam stop 7 may be an optically transparent material which is transparent to laser beam 10, but which has absorption centers in it to absorb the laser beam light as the laser beam light is transmitted through beam stop 7. Preferably, beam stop 7 has a very low reflectivity, preferably less than one percent, so that beam stop 7 stops the laser beam and does not reflect the laser beam. Beam stops are well known in the art.

Connected to any of high voltage electrode 5, deposition source 20a and processing source 20b are suitable electronic equipment for providing the necessary voltage and current levels.

Laser beam 10 projects above substrate 2. More particularly, a portion of laser beam 10 projects relatively close to the surface of substrate 2, compared with other structural elements opposed to the surface of substrate 2. Therefore particles generated either in the space inside chamber 1 or at surfaces of structural elements on the inside of chamber 1 are further from the surface of substrate 2 than laser beam 10 so that the laser beam 10 is directly between a point on each of those elements and a point on the surface of substrate 2. Preferably, laser beam 10 projects so that any structural element inside chamber 1 which is opposed to the surface of substrate 2 has the laser beam between that element and the surface of substrate 2. Also, because particles in chamber 1 may not only travel ballistically, but also may travel diffusively, laser beam 10 in any case is preferably located less than 1 inch, and more preferably less than 1 cm above the surface of substrate 2. Preferably, laser beam 10 is either scanned or fanned out to cover the surface of substrate 2 in the sense that laser beam 10 is either sequentially or simultaneously interposed between points on a region of substrate surface 10 and any point on inner surfaces of chamber 1 which opposes the surface of substrate 2. More than one laser beam may be used to so cover the substrate surface. For example, two or more fanned out laser beams which cross one another above the surface of substrate 2 may be used to provide a tent-like laser beam canopy above the surface of substrate 2.

Although FIG. 1 shows laser beam 10 to be parallel to the surface of substrate 2, it is only necessary that laser beam 10 not impinge the surface of substrate 2. Laser beam 10 may be represented by a laser beam vector which points along the direction of propagation of laser beam 10 and which has a magnitude that is proportional to the intensity of laser beam 10. The laser beam vector may be represented by a component which is parallel to the surface of substrate 2 and by a component which is perpendicular to the surface of substrate 2.

In one embodiment the laser beam vector along a portion of laser beam 10 which opposes the surface of substrate 2 has a component perpendicular to surface of substrate 2 which points away from substrate 2. When there is a component of the laser beam vector which is perpendicular to the surface of substrate 2 pointing away from substrate 2, particles will be repelled from the surface of substrate 2 by laser beam 10 and may be prevented from reaching the surface of substrate 2 even if they are not captured in laser beam 10. Repulsion of particles by a laser beam assumes that the force from the laser beam upon the particle is a repulsive force. Usually the force due to a laser beam on a particle is a repulsive force.

Figure 2:
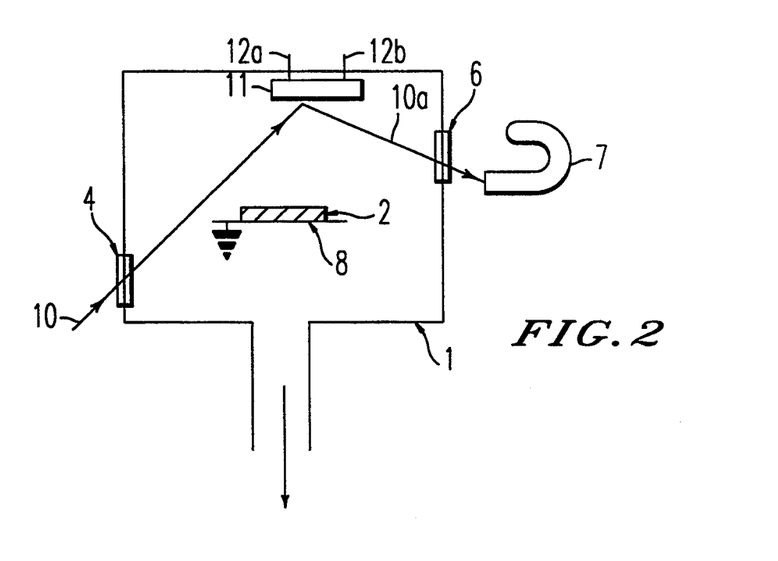
FIG. 2 is a schematic side view of a second embodiment of the novel processing chamber of the present invention.

FIG. 2 shows an embodiment in which laser beam 10 has such a positive vertical component. Laser beam 10 also impinges upon and is reflected by a surface of liquid nitrogen container particle getter 11. Liquid nitrogen container particle getter 11 includes a chamber for holding liquid nitrogen and fill tube 12a and drain tube 12b for filling and draining liquid nitrogen. Particles carried along laser beam 10 impinge upon a surface of liquid nitrogen container particle getter 11 which uses the principles of thermophoresis and, because that surface is cooled, stick to that surface. Reflected portion 10a of laser beam 10 then passes through chamber window 6 and into beam stop 7.

Figure 3:
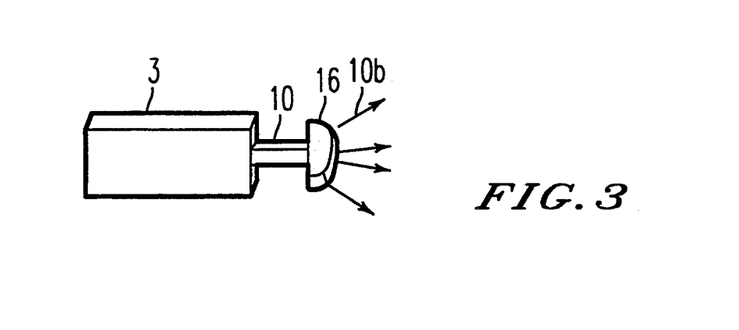
FIG. 3 is a perspective side view of a fanned out laser beam of the present invention.

FIG. 3 indicates that laser beam 10 may be spread into a fan shape in order to simultaneously cover a large portion of the surface of substrate 2. In FIG. 3, laser 3 generates laser beam 10, which traverses cylindrical lens 16 and is spread into fan beam 10b. Cylindrical lens 16 may either be inside or outside of chamber 1.

Figure 4:
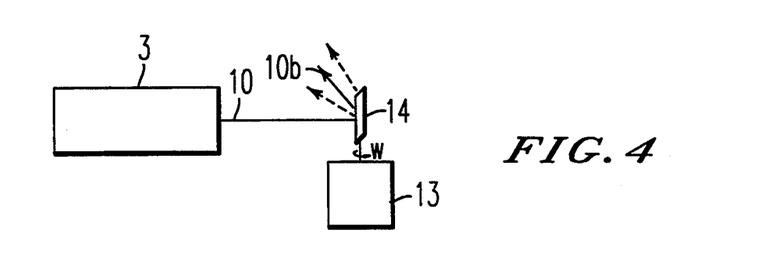
FIG. 4 is a schematic illustration of a scanned laser beam of the present invention.

FIG. 4 shows another variation for protecting the surface of substrate 2 with a laser beam. In FIG. 4, laser 3 generates laser beam 10 which is scanned in a scanning motion along paths 10b by scanning of mirror 14. Mirror 14 is rotated by motor 13 which periodically rotates mirror 14 through a fixed angle in order to periodically scan or sweep reflecting beam 10b through that fixed angle. When the periodicity of reflecting beam 10b is high enough, the same effect for particle capture which is provided by the fanned out beam shown in FIG. 3 is obtained. Other scanning mechanisms which provide a high scanning rate such as acousto-optic or piezo electric scanning may be used to scan the laser beam in order to provide a high enough scanning rate to capture all particles. An important point is that laser beam 10 is swept at a high enough frequency so that all particles whose trajectories intersect a path of the scanned beam experience a photophoretic force which captures those particles.

Figure 5A:
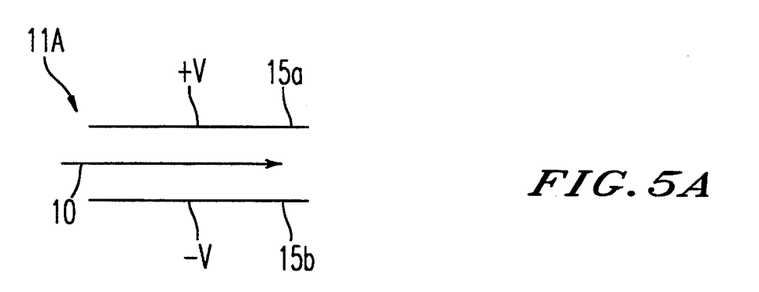
FIG. 5A is a schematic illustration of a particle getter of the present invention.

FIG. 5A shows a opposed plate particle getter 11A (uses the principles of electrophoresis) which collects particles captured by laser beam 10 and provides substantially the same function as liquid nitrogen container particle getter 11. Opposed plate particle getter 11A comprises opposed plate 15a and opposed plate 15b which are oppositely electrically biased relative to one another. Laser beam 10 traverses the space between the two plates. Particles contained by laser beam 10 and transported to the region between plates 15a and 15b are attracted to those plates because of the strong electric fields in that region.

Figure 5B:
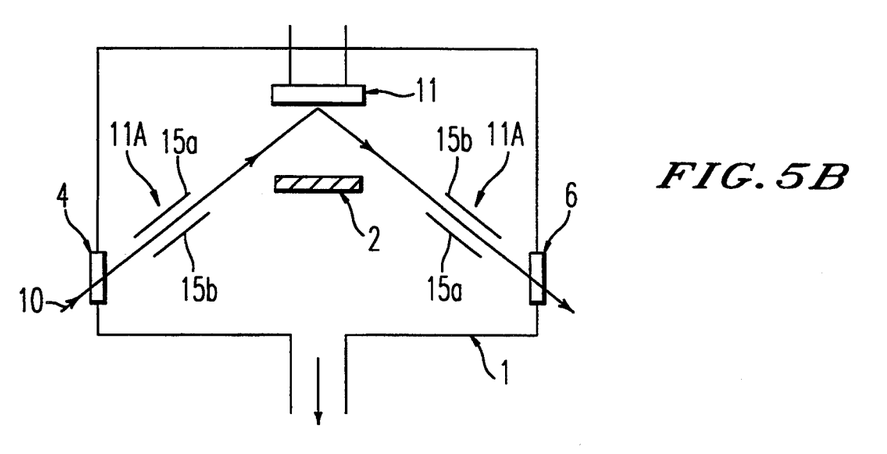
FIG. 5B is a perspective side view of a variation of the second embodiment.

FIG. 5B shows a third embodiment in which multiple opposed plate particle getters 11A are located inside the chamber but away from the surface of substrate 2. Preferably, opposed plate particle getters 11A are located near laser windows 4 and 6 in order to capture particles prior to their collision with a laser window. Location of opposed plate particle getters 11A near laser windows 4 and 6 protects those windows from impingement by particles.

FIG. 5B also shows optional liquid nitrogen container particle getter 11 for capturing particles trapped by laser beam 10 when laser beam 10 reflects off a cooled surface of liquid nitrogen particle getter 11. The reflecting surface of liquid nitrogen particle getter 11 may be degraded due to the impingement of and collection of particles thereon and the transparent surfaces of laser windows 4 and 6 may be degraded due to impingement and collection of particles thereon. Particles captured by laser beam 10 are accelerated by laser beam 10 to high enough velocities so that collision of those particles with a surface may cause surface damage. It is therefore desirable to protect the reflecting surface of liquid nitrogen particle getter 10 and laser windows 4 and 6 from particles captured by laser beam 10 to avoid damage to the reflecting surface of liquid nitrogen particle getter 10 and laser windows 4 and 6 so that the reflected laser beam remains properly focused and so that the reflecting or transmitting surfaces remains very reflective or transmissive.

Figure 5C:
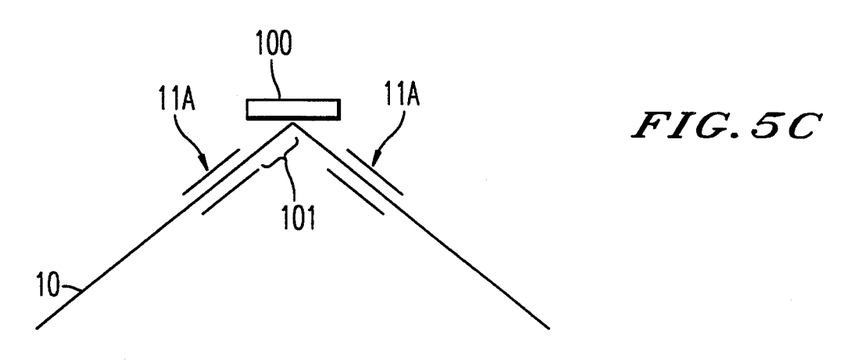
FIG. 5C is a schematic illustration of a reflecting surface of the second embodiment protected by particle getters.

FIG. 5C shows reflecting surface 100 inside chamber 1 for reflecting laser beam 10. Two opposed plate particle getters 11A are near reflecting surface 100 and positioned so that laser beam 10 passes between the opposed plates before and after laser beam 10 impinges reflecting surface 100. An edge of each of opposed plate particle getters 11A is a distance 101 from reflecting surface 100, as measured along the trajectory of laser beam 10. Since particles captured by laser beam 10 are accelerated by laser beam 10 it is desirable to minimize the distance between opposed plate particle getters 11A and reflecting surface 100 so that a path for acceleration of a particle prior to its impact on reflecting surface 100 is minimized. Therefore it is desirable that distance 101 is less than one inch and preferably less than one centimeter. Obviously, the two pairs of opposed plate particle getters 11A shown in FIG. 5A could be replaced by a single pair of opposed plates through which both the incoming and outgoing laser beams passed.

The opposed plates of opposed plate particle getter 11A function by providing a strong electric field between the plates aligned generally perpendicular to the laser beam. Obviously a geometry of charged electrodes which provides an electric field generally perpendicular to the trajectory of laser beam 10 accomplishes the function of opposed plate particle getter 11A.

For the same reasons that it is desirable to protect reflecting surface 100, of liquid nitrogen container 11, it is also desirable to protect any surface in chamber 1 at which laser beam 10 is to be reflected or transmitted, such as laser windows 4 and 6 and any reflecting surface inside chamber 1 used to direct laser beam 10. Reflecting surface 100 may be part of liquid nitrogen particle getter 11. Alternatively, reflecting surface 100 may be a mirror used to guide or steer laser beam 10 inside chamber 1.

Figure 6A:
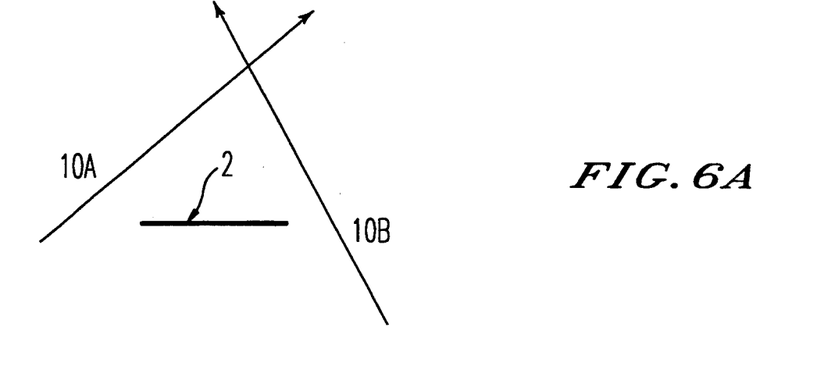
FIG. 6A is an illustration of a shape of a laser beam of FIG. 6.
Figure 6B:
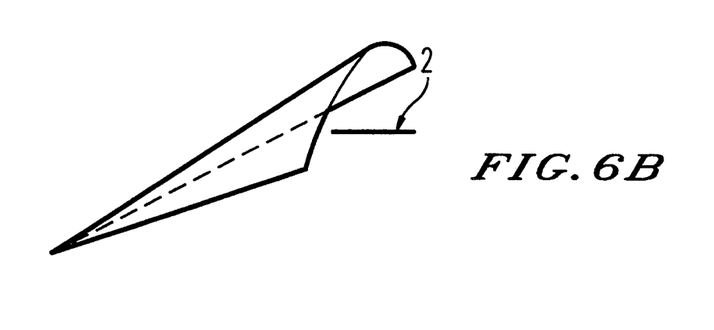
FIG. 6 is an illustration of a combination of two laser beams of the present invention.

FIG. 6 shows in cross section, laser beams 10A and 10B which cross one another above the surface of substrate 2 to form a tent-like canopy over the surface of substrate 2. That tent-like canopy is interposed between all surfaces inside chamber 1 which are above and opposed to the surface of substrate 2. Laser beams 10A and 10B may be fanned out laser beams such as laser beam 10 shown in FIG. 3. Laser beams 10A and 10B preferably have a partial cone like shape as shown for laser beam 10A in FIG. 6A in order to provide better coverage of the surface of substrate 2.

During operation, containment chamber 1 is pumped down by vacuum pump 21 to a desired operating pressure and processing of the surface of substrate 2 is commenced. At any time during that process laser 3 is turned on to provide laser beam 10 above the surface of substrate 2. Preferably, laser beam 10 has an intensity of at least $1 \times 10^4$ watts/cm$^2$ in order to provide large photophoretic forces. The function of laser beam 10 is to capture particles which would otherwise impinge upon the surface of substrate 2. Those particles are captured by forces generated by their interaction with laser beam 10 and are captured so that they remain inside laser beam 10. Depending upon the dynamics of the capture process, particles captured by laser beam 10 may either be forced along the propagation direction of laser beam 10 or forced in the direction opposite of laser beam 10, but in any case are captured by their interaction with laser beam 10 so that forces are generated to push those particles toward the center of laser beam 10.

The forces due to interaction of laser beam 10 with particles in the vacuum chamber are called photophoretic forces. Photophoretic forces consist of two components. First, a radiometric force is generated due to interaction of laser beam 10 with particles when an atmospheric pressure is present. The radiometric force is a function of the absorption of laser beam 10 by a particle and a function of atmospheric pressure near the particle. Differential heating of particle surfaces by laser beam 10 and thermal transfer from those particle surfaces to surrounding gas molecules induce different atmospheric pressures on different sides of the particle. So long as the vector direction of laser beam 10 does not intersect with the surface of substrate 2, particles captured by the photophoretic forces due to laser beam 10 will be prevented from contacting the surface of substrate 2.

The radiometric force arises because of surface heating effects due to the temperature gradient set up within a particle by absorption of radiation. A higher surface temperature of a particle imparts higher kinetic energy to adjacent gas molecules which thereby produce a larger force against that heated surface of the particle than is produced by gas molecules adjacent cooler surfaces of the particle.

Second, photophoretic forces include a radiation force which is due to momentum transfer from laser beam 10 to a particle and is only a function of the dielectric properties of the particle, the geometry of the particle and the intensity of laser beam 10.

Because the radiometric force depends upon adjacent gas molecules, that force initially increases with decreasing pressure from room pressure and then, at sufficiently low pressures, decreases with reducing pressure.

For a more complete discussion of the radiometric force and the radiation pressure force on particles see Proceedings of the Symposium on *CONTAMINATION CONTROL AND DEFECT REDUCTION IN SEMICONDUCTOR MANUFACTURING I*, edited by Dennis Schmidt, David Reedy, and Alex Schwarz, published by THE ELECTROCHEMICAL SOCIETY, Inc., 10 S. Main Street, Pennington, N.J. 08534-2896, Volume 92-21, pp. 21–41, which is hereby incorporated by reference. Also see U.S. Pat. Nos. 3,710,279 and 3,808,550 and "DIRECTION, MAGNITUDE AND CAUSES OF PHOTOPHORETIC FORCES", Hans Rohatschek, J. *Aerosol Sci.*, 16, 29–42 (1985), which are hereby incorporated by reference.

Figure 7:
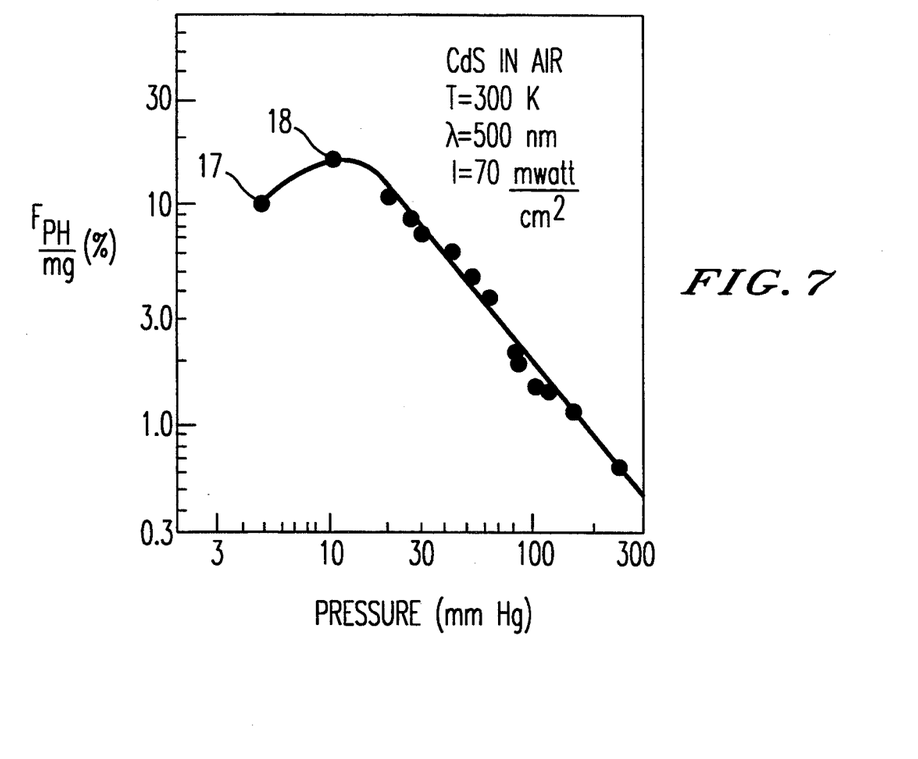
FIG. 7 is a graph illustrating radiometric force versus pressure.

FIG. 7 shows the photophoretic pressure on a particle of CdS in air. The photophoretic pressure in that case reaches a maximum at a pressure of about 10 millimeters of mercury. The pressure at which the photophoretic force is maximal has been determined to be where the ratio of the mean free path of gas molecules is approximately equal to the radius of the particle (i.e., where the Knudsen number is 1). See S. Arnold, Y. Amani, and A. Orenstein in *Reviews of Scientific Instruments*, vol. 51, pp. 1202–1204 (1980). Based upon particle sizes found in low pressure processing chambers radiometric forces on those particles are generally maximal in a pressure range between 0.1 and 10 Torr.

Figure 8:
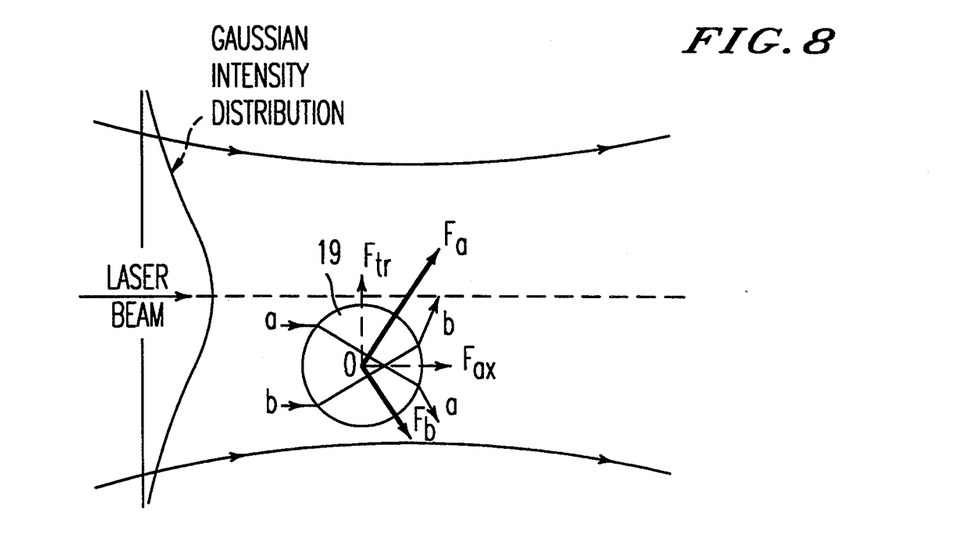
FIG. 8 is a schematic force diagram illustrating the various radiation forces present upon a particle inside a laser beam.

The radiation force also provides a force on a particle which tends to push the particle toward the central higher intensity region of laser beam 10 as indicated by FIG. 8. FIG. 8 shows along a cross section of a laser beam, the intensity distribution for that laser beam, a spherical semi-transparent particle in the laser beam path, along with the radiation forces upon that particle. The net effect of radiation forces on the particle is to drive particle along the propagation direction of the laser beam as indicated by $F_{ax}$ in FIG. 8 and to drive that particle toward the higher intensity central portion of that laser beam, as indicated by $F_{tr}$. For a more detailed explanation of the radiation force see the article by Ashkin in *Physical Review Letters*, vol. 24, p. 156 (1970), which is herein incorporated by reference. The radiation force provides a capture force which maintains a particle inside the laser beam trajectory. The radiation force can be extremely large. For example, a 1 watt laser may induce a force of $10^5$ times the gravitational force upon a submicron particle. See Ashkin A. in *Science* 210, 1081 (1980).

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A process for processing a substrate to protect it from particle contamination, comprising the steps of:
   disposing a substrate in a processing chamber;
   processing a surface of the substrate; and
   projecting a first laser beam along a first trajectory which does not contact the substrate surface during the processing step, so that if the first laser beam intersects a particle in the processing chamber a photophoretic force is generated by interaction of the first laser beam with that particle so that the photophoretic force captures the particle in the first laser beam.

2. A process according to claim 1, wherein the step of projecting further comprises;
   projecting the first laser beam with an intensity of greater than $10^4$ watts per square centimeter.

3. A process according to claim 1, wherein the step of projecting further comprises:
   projecting the first laser beam into the processing chamber.

4. A process according to claim 1, wherein the step of projecting further comprises the step of projecting the first laser beam into the processing chamber and then projecting the first laser beam out of the processing chamber.

5. A process according to claim 1, further comprising the step of:
   reflecting the first laser beam off a mirror inside the processing chamber.

6. A process according to claim 5, further comprising the step of:
   protecting the mirror by disposing a means for collecting particles adjacent to the mirror and in the first trajectory so that the first laser beam passes through the means for collecting particles.

7. A process according to claim 1, further comprising the steps of:
   controlling the pressure in the processing chamber; and
   during the step of projecting the first laser beam, depositing a thin film onto the substrate surface or etching the substrate surface.

8. A process according to claim 7, wherein the step of controlling the pressure comprises:
   reducing the pressure to between 0.1 and 10 Torr.

9. A process according to claim 1, further comprising the step of projecting a second laser beam along a second trajectory which does not contact the substrate surface during the processing step, so that when the second laser beam intersects a particle in the processing chamber a photophoretic force is generated by interaction of the second laser beam with that particle so that the photophoretic force captures that particle in the second laser beam, wherein the first and second trajectories intersect in the processing chamber.

10. A process according to claim 9, further comprising the step of:
    scanning the first laser beam to produce a scanned laser beam above the substrate surface to protect the substrate surface.

11. A process according to claim 9, further comprising the step of:
    fanning out the first laser beam to produce a fan shaped first laser beam above the substrate surface to protect the substrate surface.

12. A process according to claim 1, further comprising the step of collecting particles captured by the first laser beam.

13. A process according to claim 12, wherein the step of collecting particles further comprises:
    projecting the first laser beam along a first trajectory which intersects in the processing chamber with a cooled surface.

14. A process according to claim 12, wherein the step of collecting further comprises:
    providing opposed plates having a potential difference across the opposed plates within the processing chamber; and
    projecting the first laser beam between the opposed plates.

15. A process according to claim 12, wherein the step of collecting further comprises:
    projecting the first laser beam along a first trajectory which intersects in the processing chamber with a cooled surface;
    providing opposed plates having a potential difference across the opposed plates within the processing chamber; and
    projecting the first laser beam between the opposed plates.

16. A process according to claim 1, wherein the first trajectory has a portion which is disposed closer to a point on the substrate surface than any opposing structural element inside the processing chamber which opposes the substrate surface.

17. A process according to claim 1, wherein the step of projecting comprises projecting the first laser beam through a laser window, and further comprising the step of:

protecting the laser window by disposing a means for collecting particles adjacent the laser window.

18. A process according to claim 1, wherein the step of processing comprises the step of depositing material onto said surface of said substrate.

19. A process according to claim 1, wherein the step of processing comprises the step of etching material away from said surface of said substrate.

20. A process according to claim 1, wherein the step of processing comprises the step of plasma processing said surface of said substrate.

* * * * *